(12) United States Patent
Anderson et al.

(10) Patent No.: US 7,100,139 B1
(45) Date of Patent: Aug. 29, 2006

(54) PINOUT VIEWS FOR ALLOWED CONNECTIONS IN GUI

(75) Inventors: Douglas H. Anderson, Edmund, WA (US); Dennis Seguine, Monroe, WA (US)

(73) Assignee: Cypress Semiconductor Corporation, San Jose, CA (US)

( * ) Notice: Subject to any disclaimer, the term of this patent is extended or adjusted under 35 U.S.C. 154(b) by 100 days.

(21) Appl. No.: 10/118,682

(22) Filed: Apr. 8, 2002

(51) Int. Cl.
*G06F 17/50* (2006.01)

(52) U.S. Cl. ............................. 716/11; 716/12; 716/16; 716/17

(58) Field of Classification Search .................... 716/1, 716/11–13, 16–18
See application file for complete search history.

(56) References Cited

U.S. PATENT DOCUMENTS

| | | | |
|---|---|---|---|
| 5,801,958 A * | 9/1998 | Dangelo et al. ............... 716/18 |
| 5,818,736 A * | 10/1998 | Leibold ........................ 703/16 |
| 6,167,364 A * | 12/2000 | Stellenberg et al. .......... 703/19 |
| 6,216,254 B1 * | 4/2001 | Pesce et al. .................... 716/5 |
| 6,321,369 B1 * | 11/2001 | Heile et al. .................... 716/11 |
| 6,401,230 B1 * | 6/2002 | Ahanessians et al. .......... 716/1 |
| 6,421,817 B1 * | 7/2002 | Mohan et al. ................. 716/16 |
| 6,425,109 B1 * | 7/2002 | Choukalos et al. ............. 716/1 |
| 6,496,969 B1 * | 12/2002 | Feng et al. .................... 716/12 |
| 6,578,174 B1 * | 6/2003 | Zizzo ............................. 716/1 |
| 6,634,009 B1 * | 10/2003 | Molson et al. ................. 716/1 |
| 6,715,132 B1 * | 3/2004 | Bartz et al. .................... 716/1 |
| 6,725,441 B1 * | 4/2004 | Keller et al. .................. 716/16 |

* cited by examiner

*Primary Examiner*—Paul Dinh (57) ABSTRACT

Embodiments of the present invention relate to a method for configuring functional interconnections in a programmable device. The method comprises displaying a graphical user interface, which presents a graphical depiction of the programmable device, selecting a functional user module in the graphical user interface, selecting an interconnect input or output on the user module and displaying a graphical representation of allowable connections for the pin by highlighting those allowable connections in the graphical user interface. The desired interconnection is then selected and selection options for configuring the interconnection can be presented in and selected from a pop-up window or a drop-down list in the graphical user interface.

32 Claims, 6 Drawing Sheets

PINOUT VIEWS FOR ALLOWED CONNECTIONS IN GUI

FIELD OF THE INVENTION

Embodiments of the present invention relate to the field of configuring and programming programmable devices.

BACKGROUND OF THE INVENTION

Application-specific integrated circuits (ASICs), have been supplanted more and more by integrated circuits (ICs) that can be programmed to fulfill multiple functions. There are now many various programmable logic architectures, including, for example, programmable logic devices ("PLDs"), programmable logic arrays ("PLAs"), complex programmable logic devices ("CPLDs"), field programmable gate arrays ("FPGAs") and programmable array logic ("PALs"). Although there are differences between these various architectures, each of the architectures typically include a set of input conductors coupled as inputs to an array of logic whose outputs, in turn, act as inputs to another portion of the logic device. Complex Programmable Logic Devices ("CPLDs") are large scale PLDs that, like many programmable architectures, are configured to the specific requirements of an application by programming.

Previously, a device was programmed once for a specific function which would be its only function for its lifetime. Each of these architectures, though, has begun to be implemented in a reprogrammable form. A programmable logic device can now be re-programmed while in operation and can fulfill the functions of many different devices. One of the more complex reprogrammable devices is the programmable single-chip system, which can be implemented as any of a number of devices, anywhere from simple logic gates to those as complex as microcontrollers.

The complexity of a programmable device, most particularly a programmable single-chip system, requires complex programming of each of its configurations which can be stored. Each stored configuration reprogramming can be accomplished "on the fly" by applying the stored configuration to the device.

Initial programming of a highly complex device, though, can be tedious and time consuming. Numerous tools have been developed to aid the programmer in forming each configuration necessary to each device. However, even with current configuration tools, a programmer must track a very large number of lines of programming and device characteristics in order to properly establish a complex device configuration.

Complex device configurations require the establishment of numerous connections between functional blocks or user modules within the programmable device. User modules are the building blocks of an end configuration. In other graphical configuration tools, in order to determine allowed interconnections, a graphical representation of a wire was connected between a pin, an output for example, and an input to another functional user module, then displayed in the graphical user interface of a computer-aided configuration tool. The validity of the connection was only verifiable in complex simulation or in actual device usage, both of which are time-consuming and expensive.

Another method has been to apply an on-screen label to a selected pin's parameter list. Then any other allowed connection would also have that same label, in its parameter list, in what could become a very complex graphical image. Each potential interconnection then would have to have its parameters polled to determine its allowability.

Both of these methods have a problem in that searching for the set of allowed connections for a given pin is laborious and error-prone. It is very difficult for a user to determine the entire set of allowable connections for a pin if a wire trace needs to be performed, or if each label needs to be manually scanned, for each allowable connection.

Configuration errors are often found only in simulation of the end configuration or in actual device testing. By the time these stages are reached, the complexity of the configuration task can have an error source buried deep in configuration code.

A need exists, therefore, for a method for improving and streamlining the interconnection configuration of highly complex programmable devices to perform the functions required of each programmed device configuration. Furthermore, such a method must be user-friendly, enabling a user of normal skills to rapidly configure enormously complex programmable devices with multiple configurations.

SUMMARY OF THE INVENTION

Disclosed herein is a method for improving and streamlining the configuration of highly complex programmable devices such as programmable single-chip systems to perform the functions required of each programmed device configuration. The method disclosed is user-friendly, enabling a user of normal skills to rapidly configure enormously complex programmable devices with multiple configurations.

Embodiments of the present invention relate to a method for configuring functional interconnections in a programmable device. One embodiment comprises a method for displaying a graphical user interface, which presents a graphical depiction of the programmable device, selecting a functional user module in the graphical user interface, selecting an interconnect input or output pin on the user module and displaying a graphical representation of allowable connections for the pin by highlighting those allowable connections in the graphical user interface. The desired interconnection is then selected and selection options for configuring the interconnection can be presented in and selected from a pop-up window or a drop-down list in the graphical user interface.

In another embodiment, the present invention discloses a tool for programming an integrated circuit. The tool comprises a graphical representation of the integrated circuit displayed on a display screen with a graphical representation of input/output pins and of allowable connections for the input/output pins. The tool also displays a window in response to a selection of an input/output pin, and the window comprises a list of selectable attributes that can be assigned to the input/output pin. Among other attributes, pin type and drive type can be assigned to the input/output pin.

These and other objects and advantages of the present invention will become obvious to those of ordinary skill in the art after having read the following detailed description of the preferred embodiments which are illustrated in the various drawing figures.

BRIEF DESCRIPTION OF THE DRAWINGS

The operation and components of this invention can be best visualized by reference to the drawings.

DETAILED DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it should be understood by one of ordinary skill in the art that the present invention may be practiced without these specific details. In other instances, well-known methods, procedures, components, and circuits have not been described in detail so as not to unnecessarily obscure aspects of the present invention. At times, concepts disclosed in this discussion of embodiments of the present invention will be made more readily apparent by reference to the Figures.

Embodiments of the present invention are implemented in a graphical configuration tool. The configuration tool is incorporated herein by reference to patent application U.S. Ser. No. 09/989,570 entitled "METHOD FOR FACILITATING MICROCONTROLLER PROGRAMMING," filed Nov. 19, 2001 and assigned to the assignee of the present invention.

Embodiments of the present invention use a graphical information window in the above referenced graphical user interface presented in a graphic display. The term "graphical information," as used in this discussion, may include both icons and text. While the particular portions of the graphic display envisioned as the device selection window and the module placement window is, in this embodiment, a particular area in the overall graphic display, other embodiments could use a different area of the display.

Figure 1:
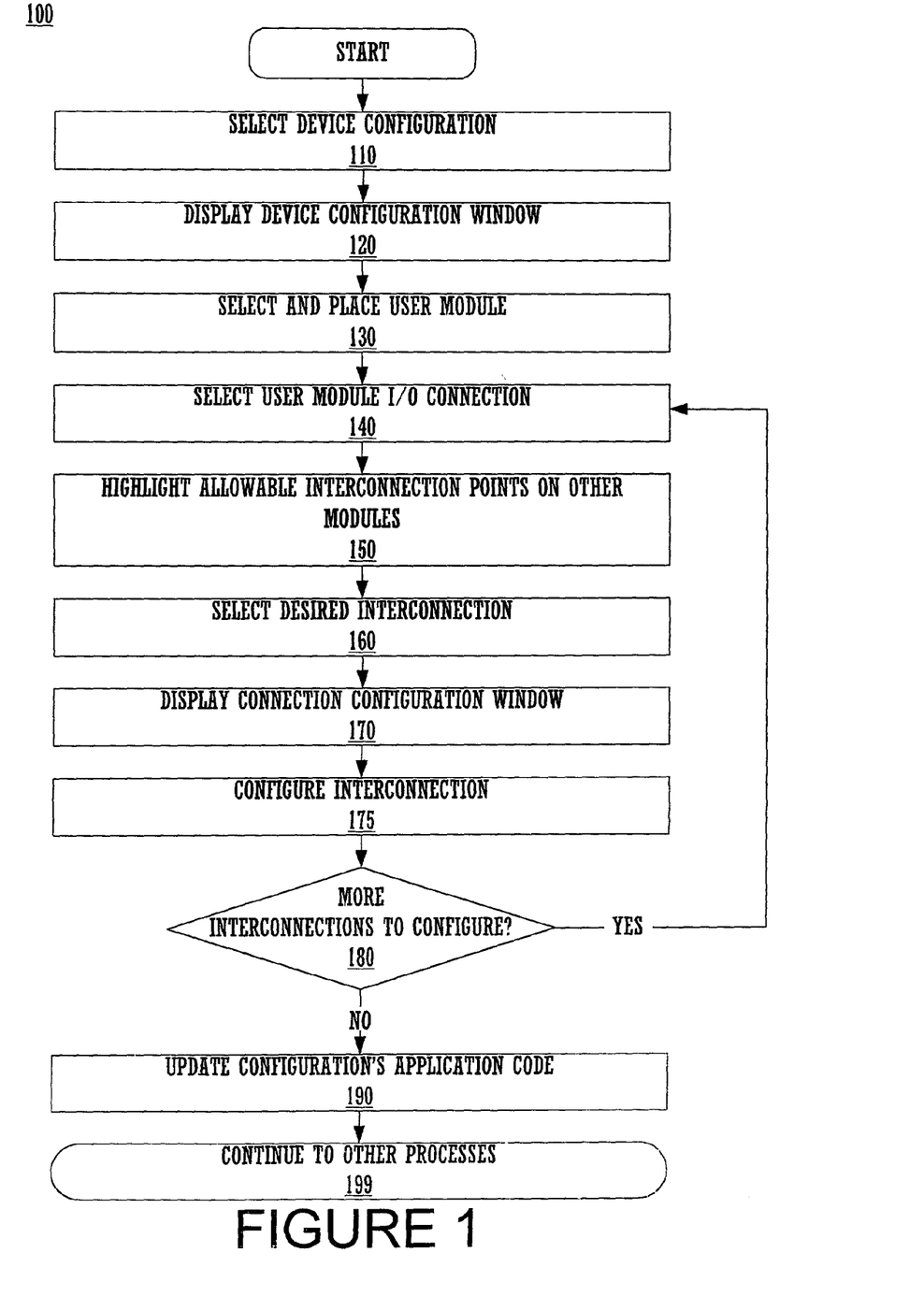
FIG. 1 illustrates a user module interconnection configuration method in accordance with one embodiment of the present invention.

FIG. 1 illustrates a method for configuring the interconnections between functional user modules in the overall configuration of a programmable integrated circuit in this embodiment of the present invention. Process 100 starts when device configuration is selected, 110. The device configuration window is displayed, 120 and a user module is selected and placed, 130, in the graphical representation of the device being configured. When an interconnection required in the desired configuration is graphically selected at 140, the connection point on the graphical user module is highlighted and all allowable connections in the existing configuration presentation are highlighted, 150. The desired interconnection is selected from the set of highlighted allowable interconnections, 160, and the interconnection parameterization window or drop-down list is displayed 170 and the interconnection is parameterized, 175, by selecting options from the parameterization pop-up window or drop-down list. Parameterization, it is noted, can also include selection of pin type and drive type. When there are no more interconnections to configure and characterize, 180, the configuration is updated in application code automatically generated at 190, and the configuration process continues to other steps at 199.

A typical graphical user interface has the ability to accept commands related to graphic information in the display. Such commands are generally input by "mouse-click." A mouse-click refers to those selection methods that involve deliberate action on the part of the user specifically related to the position of a cursor in the graphical user interface display, usually involving the user depressing a button on a cursor control mouse. A mouse click can also be implemented by a number of other means related to cursor control including cursor control by keyboard buttons.

Figure 2:
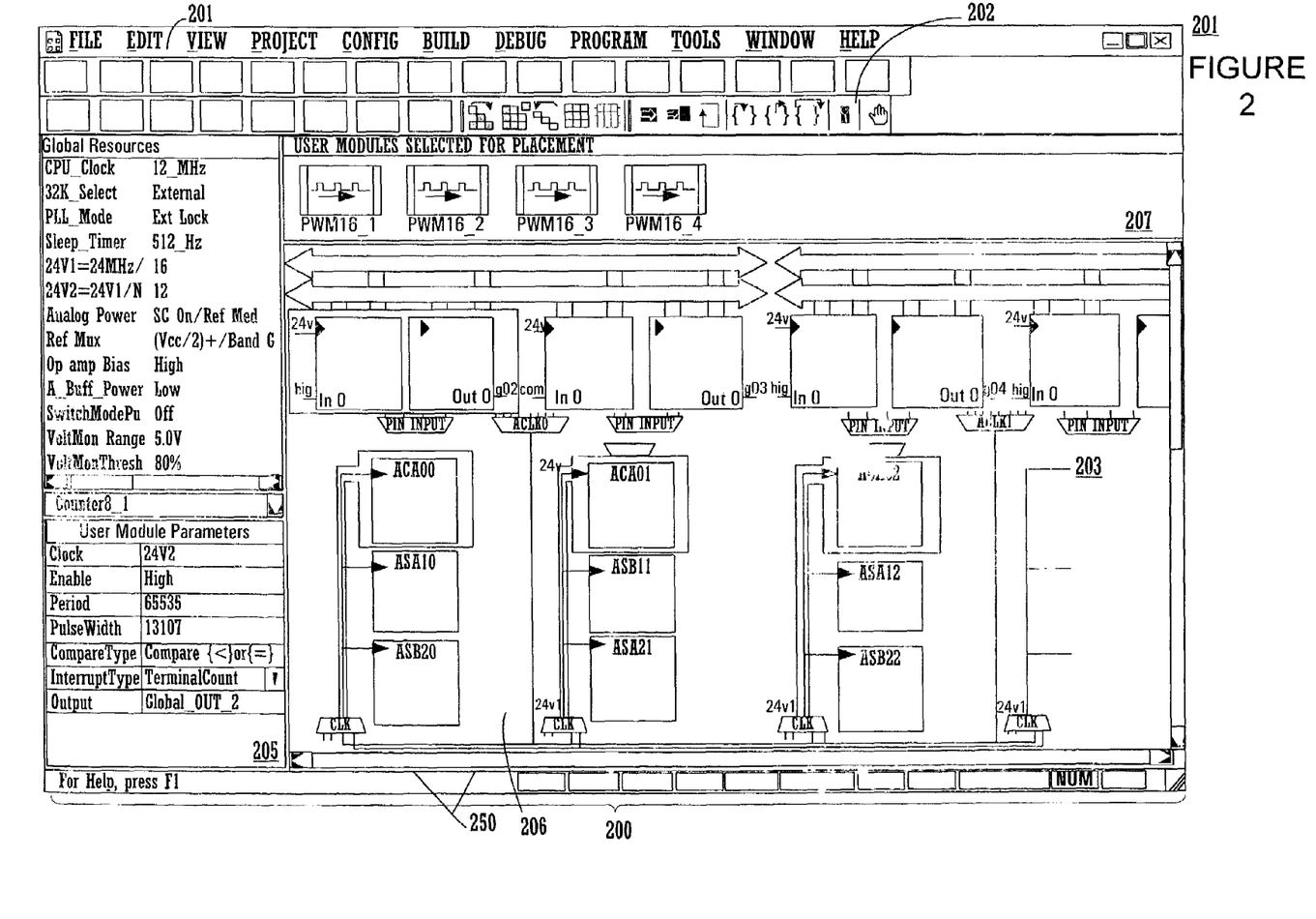
FIG. 2 illustrates an exemplary screen shot of a graphical user interface (GUI) in accordance with one embodiment of the present invention.

FIG. 2 illustrates a screenshot of the Device Placement Window in the configuration tool's graphical user interface. The configuration tool of the present embodiment employs a graphical user interface to greatly ease the lengthy and tedious process of configuring complex programmable devices, including programmable single-chip systems (e.g., as shown in FIG. 2). When the user has selected a group of user modules suitable to the configuration desired, the Device placement Window 200 is presented to further aid in device configuration. Selected user modules are shown in iconic form in window 207. Each icon is highlighted when selected for placement in the graphical presentation of the programmable device architecture, 203, as shown in device placement window 206, by the selection of Next Placement tool button (see 404 in FIG. 4). Also shown in FIG. 2 are menu bar 201 and tool bar 202 which is illustrated in detail in FIG. 4.

In the present embodiment, allowable interconnections, which are determined by the desired configuration and the available hardware, are highlighted in window 206 to aid the user in placement. One form of highlighting is shown at 250, however, it should be noted that other forms of actual highlighting that sufficiently point out allowable connections can be implemented. Global Parameters window 204 is also shown to aid the user in determining what characteristics and parameters are available. As each user module is placed, its associated parameters window 205 appears. Note that the specific exemplary screenshots used in this discussion of the present embodiment are related to the configuration of a microcontroller which is only one of many different configurable functions of the devices to which this embodiment of the present invention is addressed.

It should be noted here the graphical user interface is configured for a specific operating system (OS) as is indicated by some artifacts in the Figures. While such an existing operating system is quite common, this discussion in no way should be taken as to imply that use of the above operating system is integral to the concepts presented herein. Other operating systems capable of presenting a graphical user interface can be used in implementing-similar embodiments. It is even conceivable that some implementation of an embodiment of the present invention could be employed on a personal data assistant or some other handheld device.

Figure 3:
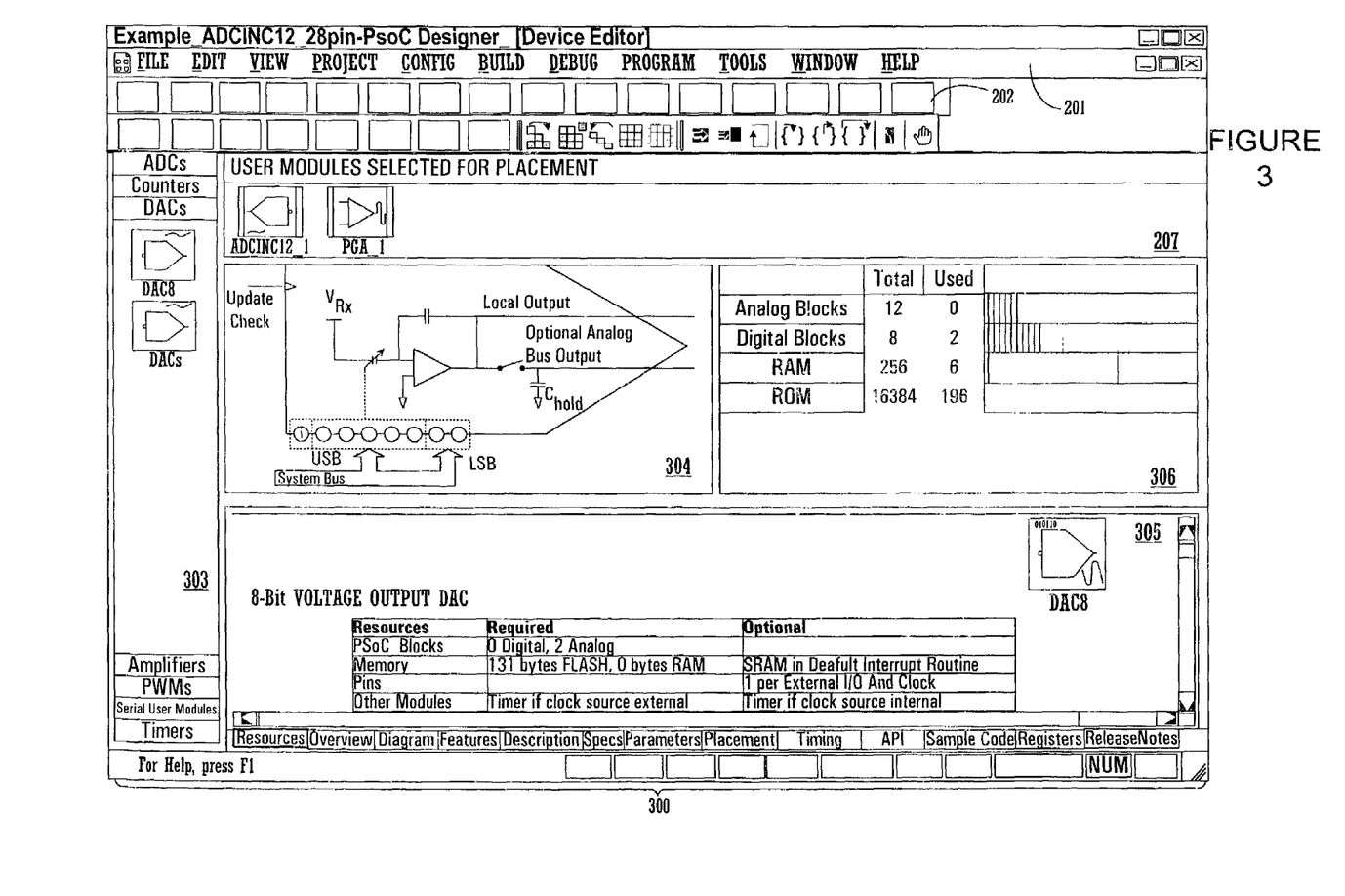
FIG. 3 illustrates a user module data sheet from a graphical user interface (GUI) in accordance with one embodiment of the present invention.

FIG. 3 illustrates a Device Selection Window in the configuration tool's graphical user interface. In this embodiment, Device Selection Window 300 incorporates menu bar 201 and tool bar 202, as noted in FIG. 2, which are common to other windows within the graphical user interface. This embodiment of the present invention facilitates the configuration of functions to be implemented in the device being configured. In order to configure complex functions in a complex programmable device such as a programmable microcontroller, functions in the form of the User Modules are combined in various arrangements that accomplish the user's end goal. Functional user modules are graphically shown and selected in Device Library Window 303. When selected, the functional characteristics of a user module are presented in window 305 and a user module icon is added to the group of selected user modules represented in window 207.

FIG. 3 also includes window 304 which shows a graphical schematic diagram of the selected user module. The schematic is used to illustrate to the user the functionality of the user module and is not to be taken as being representative of the physical implementation of the module. Each module incorporated into a configured device is actually implemented in circuitry that is reconfigurable by programming.

Note that the exemplary user module shown in FIG. 3 is a digital-to-analog converter (DAC). The inputs shown in the graphic presentation of the user module are digital bus inputs and the outputs are analog. This information, and the suitability of connections to them, is what is presented and highlighted in the Device Placement Window (see FIG. 2) when interconnections are selected.

It should be noted that, although the graphical user interface employed in this embodiment is one developed specifically for configuring programmable microcontrollers, other graphical user interfaces could be implemented for configuring other types of devices.

Window 306 is also included in FIG. 3 and includes information which shows a table of available modules remaining, taking into consideration the hardware circuitry already committed to the selected user modules. The information presented in the table of interconnection characteristics also depends on the available hardware to support the user module. Note that the functions of the various windows illustrated here may be present in different forms in different embodiments and may not be employed in others. The rearrangement of windows in the graphical user interface does not impede nor change the functionality of this embodiment of the present invention.

When the user has selected a group of user modules suitable to the configuration desired, the Device placement Window 200 shown above in FIG. 2 is presented to further aid in device configuration. Again, selected modules are shown in iconic form in window 207. Each icon is highlighted when selected for placement in the graphical presentation of the programmable device architecture, 303, shown in window 304, by the selection of Next Placement tool button (404 in FIG. 4). Available connections, determined by the available hardware and the functionality of the selected user modules, are highlighted to aid the user in placement.

Figure 4:
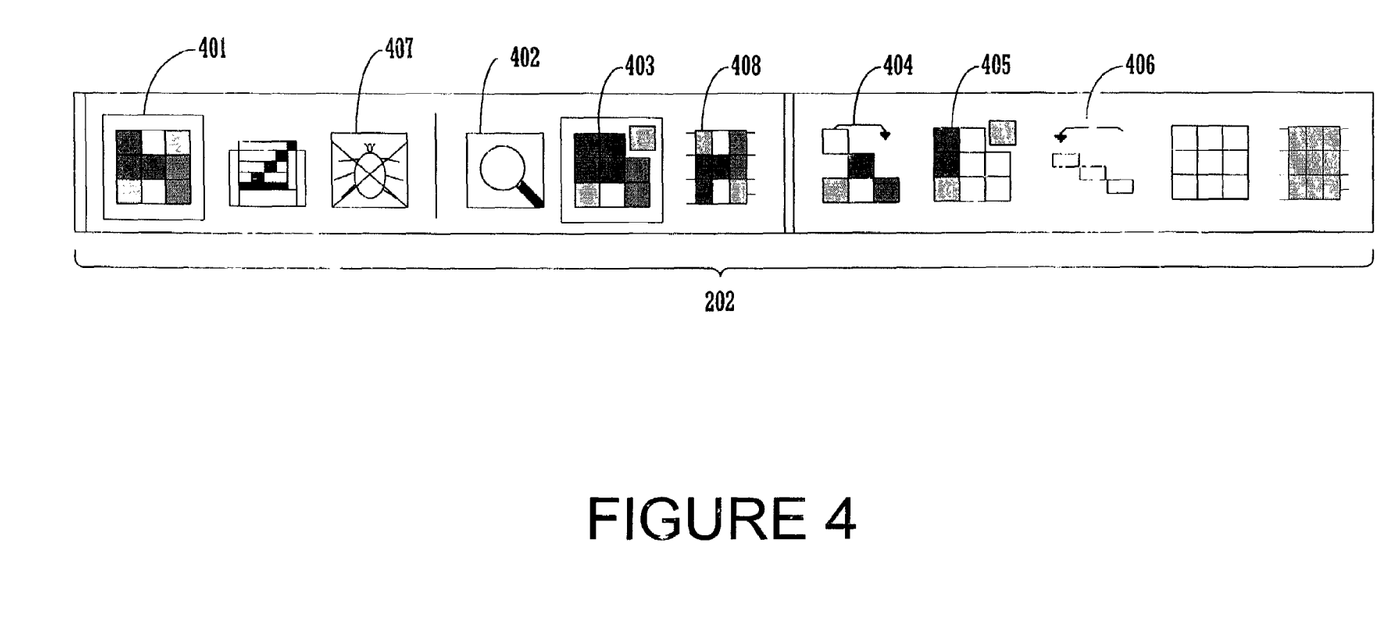
FIG. 4 illustrates a toolbar in a graphical user interface (GUI) in accordance with one embodiment of the present invention.

The embodiment of the present invention discussed here uses tool buttons in toolbar 202 to select the appropriate window for operation at hand. A portion of toolbar 202 is illustrated in FIG. 4. Toolbar 202 includes Device configuration window selection tool button 401, Device selection button 402, Device Placement button 403, Next (usable) Placement button 404, Place Module button 405, Undo Placement button 406, De-Bug window button 407 and Pin-Out Window button 408. Note that the arrangement of buttons and their iconic depictions are not limited to those shown. Other arrangements and icons could be used without changing the functions illustrated in this embodiment.

Once the user modules have been placed by the user and module interconnections have been made and characterized, the configuration tool in which this embodiment of the present invention is implemented automatically determines the configuration registers that need to be set and automatically determines their values such that the settings can be realized. This last function needs user module placement to perform because the registers that are configured reside within the programmable device hardware blocks that are allocated to the user modules and to the interconnections. Each hardware block contains its own register set. If the user module placement is changed, then the configuration tool software recomputes the proper configuration registers and values for the new hardware. If the settings are changed, then this embodiment recomputes the proper configuration registers and values for the new settings.

When registers containing user module parameters and interconnection characteristics are configured to implement the selected settings, information based on the settings is passed to processes that automatically generate source code blocks which are also called application program interfaces (APIs). These APIs are used to talk to the user modules to implement embedded functionality of the user module. The assembly code (.asm) that is automatically generated is used by the programmer to cause the user modules to perform the desired tasks. Common functions that are required to interact with the user module, such as how to start, stop a timer and "talk" to other user modules, for example, are automatically generated and represented in assembly code and header files within the software configuration tool. These automatic configuration code generation processes receive setting information from the parameterization shown in window 205 of FIG. 2 and the interconnection selection and parameters shown subsequently in FIGS. 5 and 6.

Figure 5:
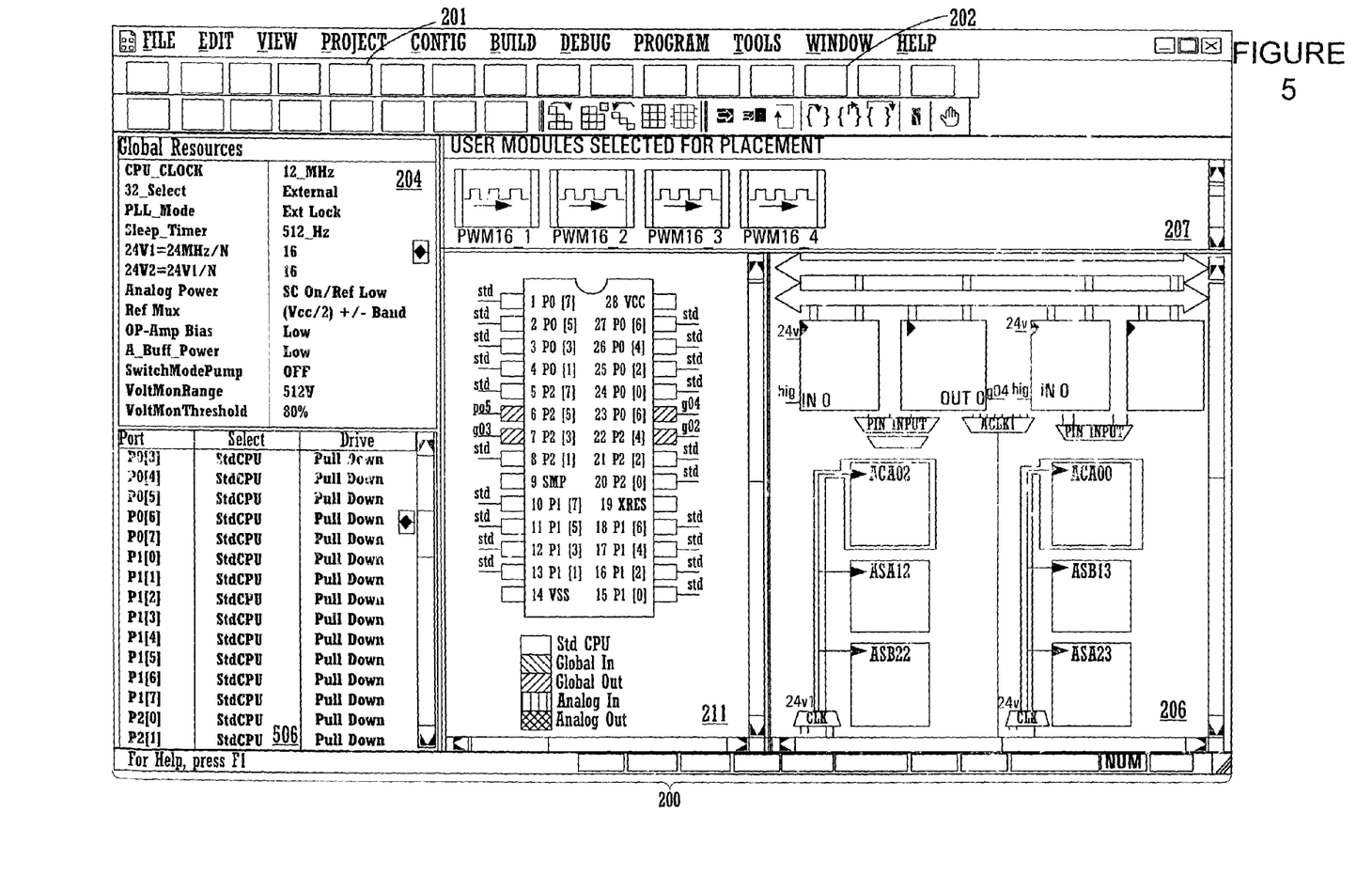
FIG. 5 illustrates a pin-out view window in accordance with one embodiment of the present invention.

FIG. 5 is shown to illustrate a pin-out window, 507, in the GUI. The GUI is as shown in FIG. 2 with pin-out window 507 and pin parameter window 506 added. When the Pin-out window button (408 in FIG. 4) is selected, the pin-out view appears that contains a graphical representation of a device or user module. When a pin in the graphical representation is selected, available allowable connections are highlighted in the device placement window 206. Pin parameters window 506 displays parameters listed for each pin in the graphic device depiction.

Figure 6:
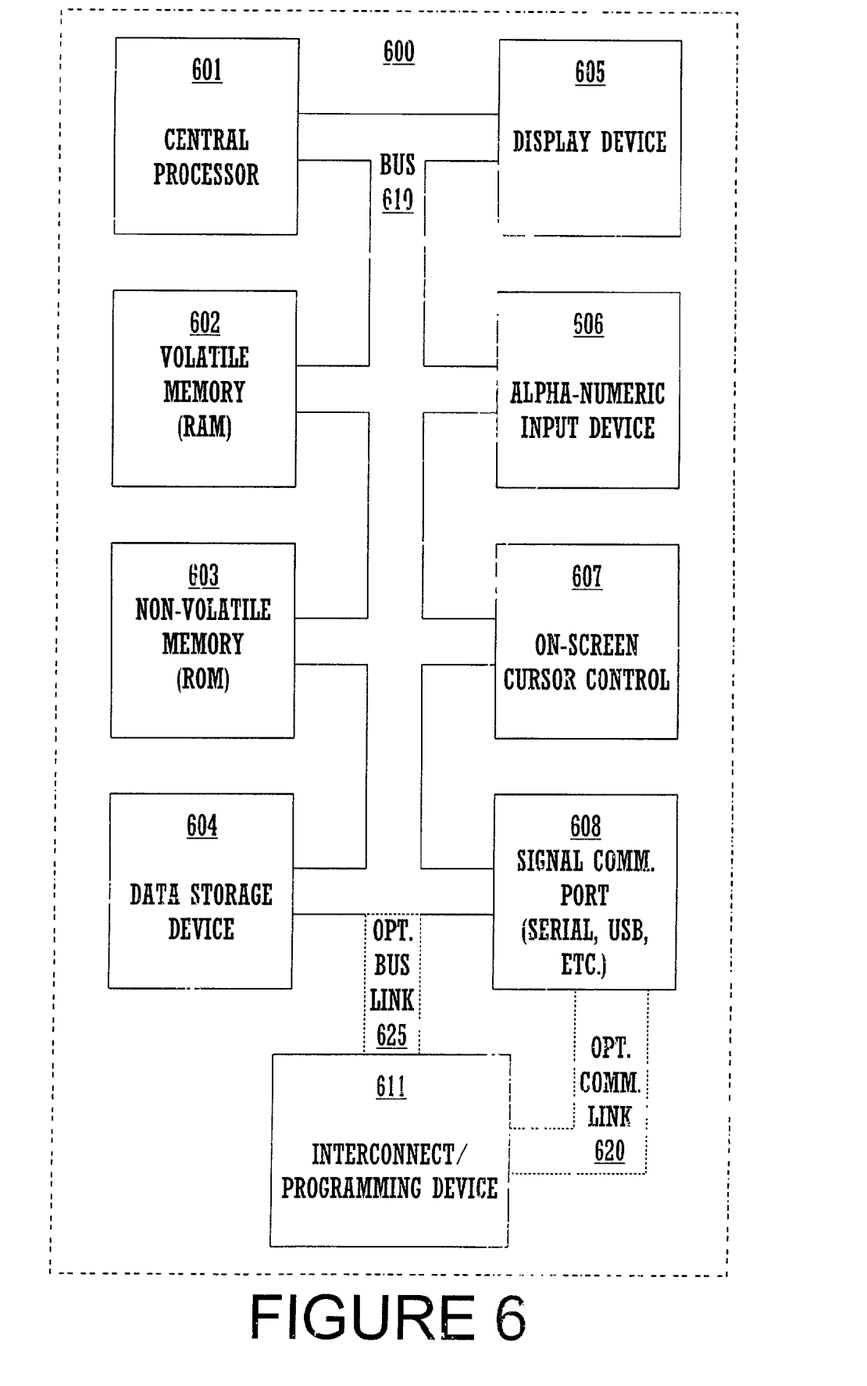
FIG. 6 illustrates a generic computer such as would be used in accordance with one embodiment of the present invention.

An embodiment of the present invention discussed here may be implemented in a computer similar to the generic computer illustrated in FIG. 6. FIG. 6 illustrates, in block diagram form, a configuration typical to a computer system. In FIG. 6, computer system 600 comprises bus 610 which electronically connects central processor 601, volatile RAM 602, non-volatile ROM 603 and data storage device 604.

Important to a concept involving a graphical user interface, as does this embodiment of the present invention, display device 605 is also connected to the bus. Similarly connected are alpha-numeric input device 606, cursor control 607, and signal I/O device 608. Signal I/O device 608 can be implemented as a serial connection, USB, an infrared transceiver or an RF transceiver. The configuration of the devices to which this embodiment of the present invention applies may vary, depending on the specific tasks undertaken. In every case with which this embodiment of the present invention is involved, however, display device 605 and cursor control 607 are implemented in one form or other. In many implementations of this embodiment, it is highly probable that interconnect/programming device 611 is also connected to computer bus 610, whether directly by bus link 625 or indirectly by signal communication 608 and communication link 620. The purpose of device 611 in this embodiment is to actually implement in device hardware the configurations developed using embodiments of the present invention. Interconnect/programming device 611 can also be implemented as a part of the circuitry suite permanently connected to the electronic environment of the targeted programmable device.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

We claim:

1. A method for configuring functional module interconnections in a programmable device, comprising:
   selecting a configuration presentation in a graphical user interface for said configuring of said functional module interconnections in said programmable device;
   selecting an interconnection pin in said programmable device in said configuration presentation;
   displaying a graphical representation of a set of all allowable connections for said interconnection pin in said graphical user interface; and
   selecting a desired connection for said functional module interconnections.

2. The method of claim 1, further comprising selecting options for said configuring of said functional module interconnections from a selection set presented in said graphical user interface.

3. A method as described in claim 2, wherein said selection set is presented in a drop-down list.

4. A method as described in claim 2, wherein said selection set is presented in a pop-up window.

5. A method as described in claim 1, wherein said graphical user interface is tailored to a specific programmable device.

6. A method as described in claim 1, wherein said programmable device is a programmable integrated circuit.

7. A method as described in claim 1, wherein said configuration presentation is graphical presentation of a representation of said programmable device.

8. A method as described in claim 1, wherein said configuration presentation is a tabular presentation.

9. A method as described in claim 1, wherein said selecting of said interconnection pin comprises mouse-clicking a graphical representation of an input/output pin.

10. A method as described in claim 1, wherein said selecting of a functional module interconnection comprises mouse-clicking a cell of a tabular representation of a input/output connection.

11. A system for configuring a functional module interconnection in a programmable device, comprising:
    computing device;
    a graphical display device communicatively coupled with said computing device;
    a graphical user interface implemented within said computing device and presented in said graphical display device;
    a graphical cursor control device communicatively coupled with said computing device and enabled to input commands to said computing device through said graphical user interface;
    said programmable device coupled with said computing device; and
    a graphical depiction of an interconnection point of a functional module in said programmable device wherein selecting said depiction of said interconnection point results in a graphical highlighting of a set of all allowable connections of said interconnection point in said programmable device.

12. A system as described in claim 11, wherein said interconnection point relates to an integrated circuit input/output pin.

13. A system as described in claim 11, wherein said computing device is a personal computer.

14. A system as described in claim 11, wherein said graphical user interface presents configuration information pertinent to said functional module interconnection.

15. A system as described in claim 11, wherein said graphical user interface presents configuration options pertinent to said functional module interconnection.

16. A system as described in claim 15, wherein said configuration options pertinent to said functional module interconnection presented in said graphical user interface are presented in pop-up windows.

17. A system as described in claim 15, wherein said configuration options pertinent to said functional module interconnection presented in said graphical user interface are presented in dropdown lists.

18. A system as described in claim 11, wherein said programmable device is a programmable integrated circuit.

19. A graphical user interface for aiding the configuration of an interconnection of a functional module in a programmable device, comprising:
    device configuration window;
    a user-selectable pin-out window in said device configuration window;
    a pin configuration parameters table;
    a pop-up window, comprising selection options pertinent to the configuration of said interconnection;
    a window for displaying a graphical presentation of a set of all allowable interconnections for said interconnection of said functional module; and
    a drop-down list comprising selection options pertinent to the configuration of said allowable interconnections wherein said graphical user interface is enabled to accept user input commands in the process of configuring said programmable device.

20. A graphical user interface as described in claim 19, wherein said graphical user interface is enabled to accept mouse-click commands as said user input.

21. A graphical user interface as described in claim 19, wherein said device configuration window is specifically tailored to program functional module interconnection configurations on a programmable integrated circuit.

22. A graphical user interface as described in claim 19, wherein said pop-up window comprises selection options pertinent to the configuration of the input/output pins of said programmable device.

23. A graphical user interface as described in claim 19, wherein said pop-up window is enabled to appear when an interconnection pin is selected by a mouse-click in said pin-out window.

24. A graphical user interface as described in claim 23, wherein said selection options in said pop-up window are selectable by a mouse-click.

25. A graphical user interface as described in claim 19, wherein said pin configuration parameters table comprises selection options pertinent to the configuration of said interconnections.

26. A graphical user interface as described in claim 19, wherein said window for displaying a graphical presentation of allowable connections for said programmable device is enabled to highlight pins in said graphical presentation.

27. A graphical user interface as described in claim 19, wherein said drop-down list is enabled to appear when a tabular listing associated with said interconnections is selected by mouse-click-in said pin configuration parameters table.

28. A graphical user interface as described in claim 19, wherein said drop-down list comprises selection options pertinent to the configuration of said interconnections.

29. A graphical user interface as described in claim 19, wherein said pop-up window disappears from said graphical user interface when a mouse-click is made outside said pop-up window.

30. A computer-usable medium having computer-readable program code embodied therein for causing a computer system to perform a method for configuring input/output interconnections in a programmable device, comprising:

selecting a configuration presentation in a graphical user interface for said configuring of said input/output interconnections in said programmable device;

selecting an input/output pin in said programmable device in said configuration presentation;

displaying a graphical representation of a set of all allowable connections for said input/output pin in said graphical user interface; and selecting a desired connection for said input/output pin.

31. The computer-usable medium of claim 30, wherein said displaying said graphical representation of said allowable connections in said graphical user interface comprises highlighting said allowable connections.

32. The computer-usable medium of claim 30, wherein said method further comprises selecting options for said configuring of said input/output interconnections from a selection set presented in said graphical user interface.

* * * * *